(12) United States Patent
Costrini et al.

(10) Patent No.: US 7,871,893 B2
(45) Date of Patent: Jan. 18, 2011

(54) METHOD FOR NON-SELECTIVE SHALLOW TRENCH ISOLATION REACTIVE ION ETCH FOR PATTERNING HYBRID-ORIENTED DEVICES COMPATIBLE WITH HIGH-PERFORMANCE HIGHLY-INTEGRATED LOGIC DEVICES

(75) Inventors: Gregory Costrini, Hopewell Junction, NY (US); David M. Dobuzinsky, New Windsor, NY (US); Thomas S. Kanarsky, Hopewell Junction, NY (US); Munir D. Naeem, Poughkeepsie, NY (US); Christopher D. Sheraw, Poughkeepsie, NY (US); Richard Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 12/020,887

(22) Filed: Jan. 28, 2008

(65) Prior Publication Data

US 2009/0189242 A1    Jul. 30, 2009

(51) Int. Cl.
*H01L 21/76* (2006.01)
*H01L 21/763* (2006.01)

(52) U.S. Cl. ............. 438/400; 438/309; 438/353; 438/359; 438/405

(58) Field of Classification Search ................ 257/506; 438/386, 591, 424, 404, 478
See application file for complete search history.

(56) References Cited

U.S. PATENT DOCUMENTS

| | | | |
|---|---|---|---|
| 6,555,891 B1 | 4/2003 | Furukawa et al. | |
| 7,071,072 B2 | 7/2006 | Mo et al. | |
| 7,118,986 B2 | 10/2006 | Steigerwalt et al. | |
| 2006/0105536 A1* | 5/2006 | Cheng et al. | 438/386 |
| 2008/0085593 A1* | 4/2008 | Miyagawa | 438/591 |

* cited by examiner

*Primary Examiner*—N Drew Richards
*Assistant Examiner*—Mamadou Diallo
(74) *Attorney, Agent, or Firm*—Gibb I.P. Law Firm, LLC; Lan D. MacKinnon, Esq.

(57) ABSTRACT

Disclosed are embodiments of a hybrid-orientation technology (HOT) wafer and a method of forming the HOT wafer with improved shallow trench isolation (STI) structures for patterning devices in both silicon-on-insulator (SOI) regions, having a first crystallographic orientation, and bulk regions, having a second crystallographic orientation. The improved STI structures are formed using a non-selective etch process to ensure that all of the STI structures and, particularly, the STI structures at the SOI-bulk interfaces, each extend to the semiconductor substrate and have an essentially homogeneous (i.e., single material) and planar (i.e., divot-free) bottom surface that is approximately parallel to the top surface of the substrate. Optionally, an additional selective etch process can be used to extend the STI structures a predetermined depth into the substrate.

13 Claims, 7 Drawing Sheets

METHOD FOR NON-SELECTIVE SHALLOW TRENCH ISOLATION REACTIVE ION ETCH FOR PATTERNING HYBRID-ORIENTED DEVICES COMPATIBLE WITH HIGH-PERFORMANCE HIGHLY-INTEGRATED LOGIC DEVICES

BACKGROUND

1. Field of the Invention

The embodiments of the invention generally relate to hybrid-orientation technology (HOT) wafers and, more particularly, to a trench isolation structure for patterning devices on a HOT wafer and an associated method for forming the trench isolation structure using a non-selective etch.

2. Description of the Related Art

Typically, device patterning on silicon-on-insulator (SOI) wafers is accomplished using shallow trench isolation structures formed with a selective silicon etch chemistry that stops on the top surface of a buried oxide (BOX) layer. Unfortunately, application of this selective STI etch process to form shallow trench isolation structures on hybrid-orientation technology (HOT) wafers and, particularly, on HOT wafers at the 45 nm or smaller technology creates very small trench features at the bulk/SOI interface. This is due to overlay (OL) tolerances between the STI lithography pattern and the underlying bulk/SOI pattern. Specifically, the problem is that the resulting STI feature formed in the bulk silicon is trimmed by the buried-oxide layer of the SOI portion, which is below the ground rule and would likely exceed the STI oxide fill capability for the technology node. There is no known solution in practice since current silicon integration uses either bulk or SOI substrates.

SUMMARY

In view of the foregoing, disclosed herein are embodiments of a hybrid-orientation technology (HOT) wafer and a method of forming the HOT wafer with improved shallow trench isolation (STI) structures for patterning devices in both silicon-on-insulator (SOI) regions, having a first crystallographic orientation, and bulk regions, having a second crystallographic orientation. The improved STI structures are formed using a non-selective etch process to ensure that all of the STI structures and, particularly, those STI structures at the SOI-bulk interfaces (i.e., interface STIs) each extend to the semiconductor substrate and have an essentially homogeneous and planar bottom surface, which is approximately parallel to the top surface of the substrate. Optionally, an additional selective etch process can be used to extend the STI structures a same predetermined depth into the substrate.

More particularly, disclosed herein are embodiments of an integrated circuit (IC) structure. The IC structure can comprise a hybrid-orientation technology (HOT) wafer. The HOT wafer can comprise a semiconductor substrate (e.g., a bulk silicon substrate). A silicon-on-insulator (SOI) stack can be positioned on a first portion of the semiconductor substrate. The SOI stack can comprise a buried insulator layer (e.g., a buried oxide layer) on the semiconductor substrate and a first semiconductor layer (e.g., a silicon layer) on the buried insulator layer. The first semiconductor layer can have a first crystallographic orientation. A second semiconductor layer can be positioned on a second portion of the semiconductor substrate. The second semiconductor layer can comprise an epitaxial silicon layer positioned laterally adjacent to the SOI stack. The second semiconductor layer and the semiconductor substrate can have a second crystallographic orientation different from the first crystallographic orientation. The thicknesses of the second semiconductor layer and the SOI stack can be approximately equal.

Additionally, the IC structure can comprise one or more shallow trench isolation (STI) structures positioned across the HOT wafer for patterning devices in both the first semiconductor layer (i.e., the SOI regions) and the second semiconductor layer (i.e., the bulk regions). Specifically, the IC structure can comprise a first STI region (i.e., an interface STI) positioned at the interface between the second semiconductor layer and the SOI stack. This first STI region can extend vertically down to the semiconductor substrate. Thus, on one side (i.e., on a first side), this first STI region extends through the first semiconductor layer and the insulator layer to the semiconductor substrate and on the opposite side (i.e., on a second side opposite the first side), this first STI region extends through the second semiconductor layer to the semiconductor substrate. The IC structure can also comprise at least one additional STI region. For example, an additional STI region can extend through the first semiconductor layer and the insulator layer only into the semiconductor substrate. Another additional STI region can extend through second semiconductor layer only into the semiconductor substrate. The bottom surfaces of all of these STI regions (including the first STI region and any additional STI regions) can be essentially homogenous and planar (i.e., can comprise the same divot-free material) and can be approximately parallel to the top surface of the semiconductor substrate. The bottom surfaces of all of these STI regions can further be located just at the top surface of the semiconductor substrate or, alternatively, at a same predetermined depth below the top surface of the semiconductor substrate.

Also disclosed are embodiments of a method of forming the above-described IC structure. Specifically, the method embodiments can comprise providing an HOT wafer. The HOT wafer can comprise a semiconductor substrate (e.g., a bulk silicon substrate). An SOI stack can be positioned on a first portion of the semiconductor substrate. This SOI stack can comprise a buried insulator layer on the semiconductor substrate and a first semiconductor layer (e.g., a silicon layer) on the insulator layer. The first semiconductor layer can have a first crystallographic orientation. A second semiconductor layer (e.g., an epitaxial silicon layer) can be positioned on a second portion of the semiconductor substrate. This second semiconductor layer can also be positioned laterally adjacent the SOI stack. The second semiconductor layer and the SOI stack can have approximately equal thicknesses. The second semiconductor layer and the semiconductor substrate can have a second crystallographic orientation different from the first crystallographic orientation of the first semiconductor layer. Additionally, a sidewall spacer can be positioned immediately adjacent to and can extend the length of a sidewall of the SOI stack on the semiconductor substrate such that it is between the SOI stack and the second semiconductor layer. This sidewall spacer and the insulator layer can comprise different dielectric materials. For example, the buried insulator layer can comprise an oxide material and the sidewall spacer can comprise a nitride material.

Next, multiple etch processes can be performed in order to simultaneously form one or more trenches positioned across the HOT wafer. These trenches can be filled with an isolation material, thereby forming STI structures for isolation of devices in both the first semiconductor layer (i.e., the SOI regions) and the second semiconductor layer (i.e., the bulk regions). Specifically, the multiple etch processes can be performed in order to form a first trench (i.e., an interface trench) between the second semiconductor layer and the SOI stack to the semiconductor substrate and, optionally, to simultaneously form one or more additional trenches through the first semiconductor layer and the buried oxide layer to the semiconductor substrate and/or through the second semiconductor layer to the semiconductor substrate. The multiple etch processes can be performed so that the bottom surfaces of all of these STI regions (including the first STI region and any additional STI regions) are essentially homogenous and planar (i.e., comprise the same divot-free material) and also are approximately parallel to the top surface of the semiconductor substrate. They can further be performed such that the bottom surfaces of all of these STI regions can are located just at the top surface of the semiconductor substrate or, alternatively, at a same predetermined depth below the top surface of the semiconductor substrate.

More specifically, the multiple etch processes can include, but are not limited to, the following process steps. A pad layer may be formed on the HOT wafer. The pad layer can comprise, for example, a pad oxide layer above the first and second semiconductor layers and a pad nitride layer above the pad oxide layer. A hardmask layer can be formed on the pad layer. The hardmask layer can then be lithographically patterned in order to define the first trench above the interface between the first semiconductor layer and the second semiconductor layer (i.e., above the sidewall spacer) and, optionally, to define any additional trenches. For example, the hardmask layer can also be patterned to define one or more additional trenches above only the first semiconductor layer and/or above only the second semiconductor layer. Alternatively, a bi- or tri-layer resist process can be used in place of the hardmask process. Once the hardmask layer is patterned, an anisotropic etch process can be performed in order to etch through the pad layer, stopping on the first semiconductor layer and the second semiconductor layer.

Next, a non-selective etch process can be performed in order to remove the sidewall spacer, to extend the first trench (i.e., the interface trench) and any optional additional trenches down to the semiconductor substrate and further to ensure that all of the trenches, including the first trench and any additional trenches, have homogeneous and planar bottom surfaces (i.e., bottom surfaces that comprise the same divot-free material) that are approximately parallel to the top surface of the substrate. This non-selective etch process can comprise, for example, a non-selective reactive ion etch (RIE) process capable of anisotropically etching the first semiconductor layer, the second semiconductor layer, the insulator layer, and the sidewall spacer at a same rate. For example, the non-selective RIE process can comprise a trifluoromethane ($CHF_3$) and/or a tetraflouromethane ($CF_4$)-based RIE process. This non-selective RIE process can stop just at the top surface of the semiconductor substrate.

Following the non-selective RIE process, an additional etch process can be performed in order to extend the first trench and any additional trenches a same predetermined depth into the semiconductor substrate. This additional etch process can comprise a selective anisotropic RIE process with chemistry selective to the semiconductor substrate over the insulator layer to ensure that the sidewalls of the trench remain smooth and perpendicular to the substrate surface. For example, the additional etch process can comprise a selective anisotropic RIE process with hydrogen bromide (HBr) and oxygen ($O_2$)-based chemistry. Once the trenches are etched to the desired depth, they can be filled with an isolation material, thereby creating the improved STI structures, described above, for patterning devices in both the first semiconductor layer (i.e., the SOI regions) and the second semiconductor layer (i.e., the bulk regions).

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1:
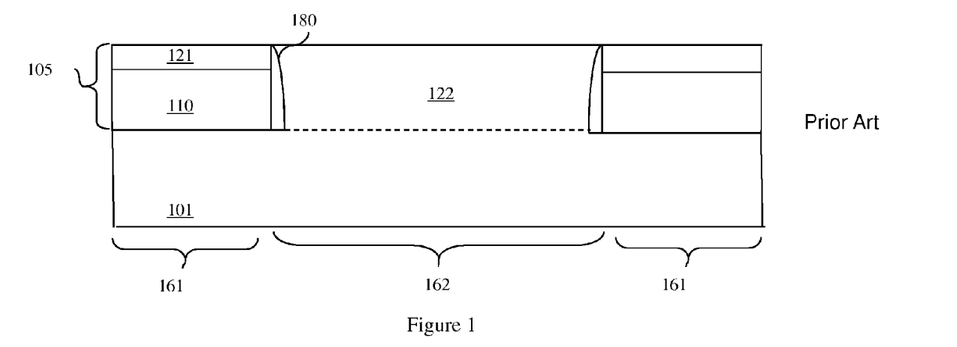
FIG. 1 is a schematic diagram illustrating a hybrid-orientation technology (HOT) wafer.

FIG. 1 illustrates a conventional HOT wafer 100. The HOT wafer 100 comprises a semiconductor substrate 101. The semiconductor substrate 101 comprises a bulk semiconductor substrate 101 (e.g., a bulk silicon substrate). A silicon-on-insulator (SOI) stack 105 is positioned on a first portion 161 of the semiconductor substrate 101. This SOI stack 105 comprises a buried insulator layer 110 (e.g., an approximately 1450 Å buried oxide layer) positioned above the semiconductor substrate 101 and a first semiconductor layer 121 (e.g., an approximately 1450 Å silicon layer) positioned above the buried insulator layer 110. A second semiconductor layer 122 (e.g., an approximately 2000 Å epitaxial silicon layer) is positioned above a second portion 162 of the semiconductor substrate 101 and further positioned laterally adjacent to the SOI stack 105. The first semiconductor layer 121 has a first crystallographic orientation (e.g., a {100} orientation optimal for n-type field effect transistor (NFET) performance). Contrarily, the semiconductor substrate and epitaxial second semiconductor layer 122 have a second crystallographic orientation that is different from the first crystallographic orientation (e.g., a {110} orientation optimal for p-type field effect transistor (PFET) performance). Sidewall spacers (e.g., nitride sidewall spacers) separate the second semiconductor layer 122 from the first semiconductor layer and buried insulator layer.

HOT wafers 100, as described above, are typically formed by providing an SOI wafer. A pad layer (e.g., a pad oxide and/or a pad nitride layer) is formed on the SOI wafer. Then, an anti-reflective coating (ARC) is formed on the pad layer and a photoresist layer is formed on the ARC. The photoresist layer is then lithographically patterned to define the portion 162 of the substrate 101 on which the epitaxial second semiconductor layer 122 will be formed. A reactive ion etch (RIE) process is performed in order to create an opening in the SOI stack 105 and to expose the defined portion 162 of the substrate 101. Next, sidewall spacers 180 (e.g., nitride sidewall spacers) are formed within the opening, using conventional sidewall spacer formation techniques, and an epitaxial deposition process is performed in order to fill the opening with the second semiconductor layer 162.

As mentioned above, device patterning on silicon-on-insulator (SOI) wafers is accomplished using shallow trench isolation structures formed with a selective silicon etch chemistry that stops on the top surface of a buried oxide (BOX) layer. Unfortunately, application of this selective STI etch process to form shallow trench isolation structures on hybrid-orientation technology (HOT) wafers (e.g., see HOT wafer 100, described above) and, particularly, on HOT wafers at the 45 nm or smaller technology creates very small trench features at the bulk/SOI interface. This is due to overlay (OL) tolerances between the STI lithography pattern and the underlying bulk/SOI pattern. Specifically, the problem is that the resulting STI feature formed in the bulk silicon is trimmed by the buried-oxide layer of the SOI portion, which is below the ground rule and would likely exceed the STI oxide fill capability for the technology node.

Figure 2:
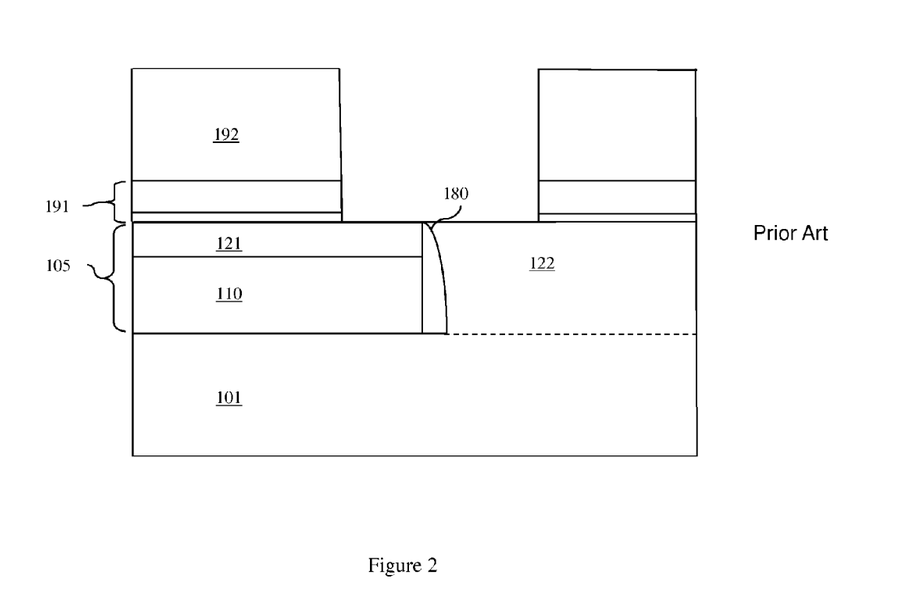
FIGS. 2-4 are schematic diagrams illustrating a method of forming a shallow trench isolation (STI) structure at the interface between silicon-on-insulator (SOI) and bulk silicon regions of the HOT wafer of FIG. 1.
Figure 3:
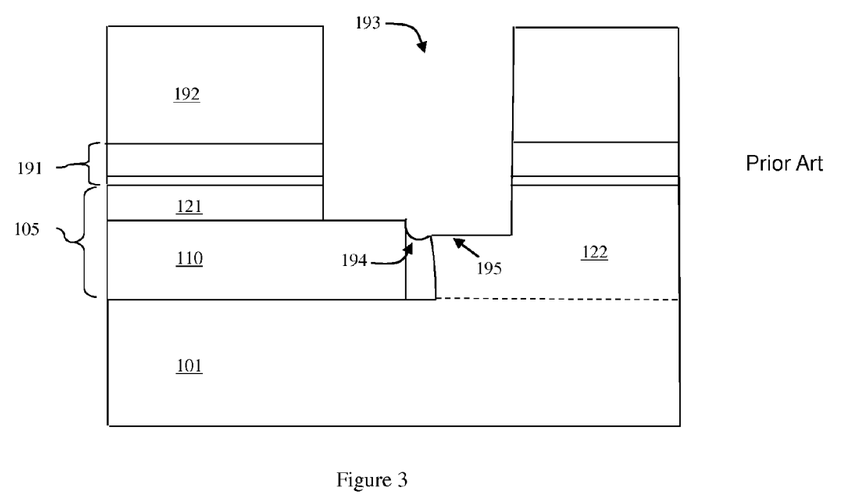
Figure 4:
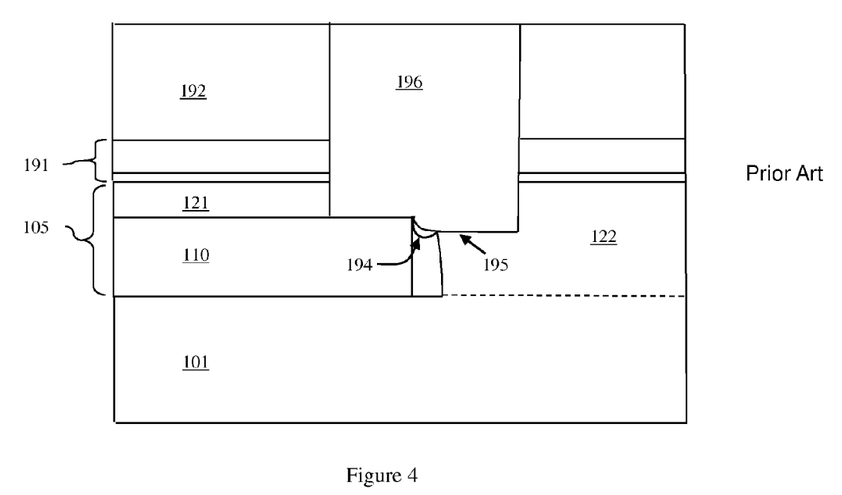

More specifically, FIG. 2 illustrates a HOT wafer 100 in which a hardmask layer 192 and pad layer 191 (e.g., a pad oxide layer and/or a pad nitride layer) are lithographically patterned and etched to define a trench to be formed at the interface between the first semiconductor layer 121 and the SOI stack 105. However, as illustrated in FIG. 3, if a conventional selective silicon etch chemistry (e.g., a hydrogen bromide (HBr) and oxygen (O2)-based chemistry) is used to form this trench 193, the etch on one side of the trench 193 will stop on the buried oxide layer 121, but will continue into the sidewall spacer 180 and second semiconductor layer 122 on the opposite side of the trench 193. Furthermore, the nitride sidewall spacer 180 will etch at a faster rate than the second semiconductor layer 122. Thus, the bottom surface of 195 of the trench 193 will be non-homogeneous (i.e., will have oxide, nitride, and silicon portions) and will be non-planar (i.e., will have a divot 194 between the buried insulator layer 110 and the second semiconductor layer 122). Additionally, the trench 193 will not extend deep enough into the wafer to provide adequate isolation from devices formed in the second semiconductor layer 122 (i.e., bulk devices). Finally, as illustrated in FIG. 4, the divot 194 at the bottom of the trench 193 may exceed STI oxide fill capabilities and, thus, may result in void in the resulting STI structure 196 may at the divot 194. Such a void can create STI reliability issues.

In view of the foregoing, disclosed herein are embodiments of a hybrid-orientation technology (HOT) wafer and a method of forming the HOT wafer with improved shallow trench isolation (STI) structures for patterning devices in both silicon-on-insulator (SOI) regions, having a first crystallographic orientation, and bulk regions, having a second crystallographic orientation. The improved STI structures are formed using a non-selective etch process to ensure that all of the STI structures and, particularly, the STI structures at the SOI-bulk interfaces, extend to the semiconductor substrate and have an essentially homogeneous and planar bottom surface (i.e., a bottom surface that comprises a single divot-free material) that is approximately parallel to the top surface of the substrate. Optionally, an additional selective etch process can be used to extend the STI structures a same predetermined depth into the substrate.

Figure 5:
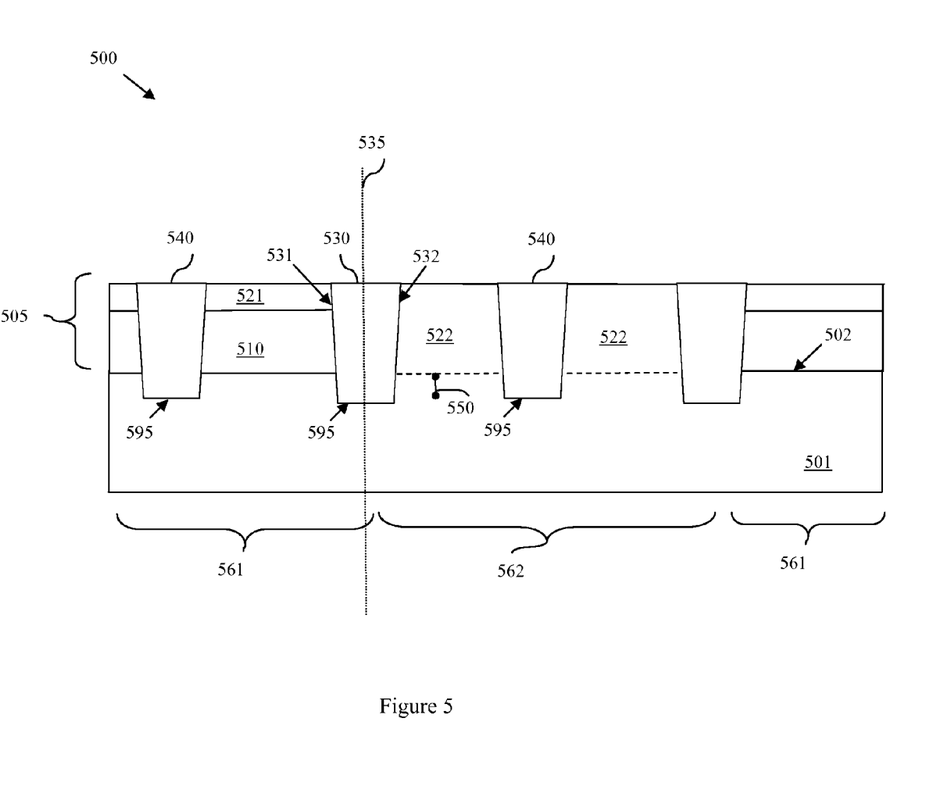
FIG. 5 is a schematic diagram illustrating an embodiment of the integrated circuit structure of the present invention.

More particularly, referring to FIG. 5, disclosed herein are embodiments of an integrated circuit (IC) structure 500. The IC structure 500 can comprise a hybrid-orientation technology (HOT) wafer, similar to the HOT wafer 100 described above. That is, the HOT wafer can comprise a semiconductor substrate 501 (e.g., a bulk silicon substrate). The HOT wafer can also comprise a silicon-on-insulator (SOI) stack 505 positioned on a first portion 561 of the semiconductor substrate 501. The SOI stack 505 can comprise a buried insulator layer 510 (e.g., an approximately 1450 Å buried oxide layer) on the semiconductor substrate 101 and a first semiconductor layer 521 (e.g., an approximately 550 Å silicon layer) on the buried insulator layer 510. The first semiconductor layer 521 can have a first crystallographic orientation (e.g., a {100} orientation optimal for n-type field effect transistor (NFET) performance). The HOT wafer can also comprise a second semiconductor layer 522 positioned on a second portion 562 of the semiconductor substrate 501 and further positioned laterally adjacent to the SOI stack 505. The second semiconductor layer 522 can comprise an approximately 2000 Å epitaxial silicon layer. The second semiconductor layer 522 and the semiconductor substrate 501 can have a second crystallographic orientation that is different from the first crystallographic orientation of the first semiconductor layer 521 (e.g., a {110} orientation optimal for p-type field effect transistor (PFET) performance). The thicknesses of the second semiconductor layer 522 and the SOI stack 505 can be approximately equal (e.g., approximately 2000 Å each).

Additionally, the IC structure 500 can comprise one or more shallow trench isolation (STI) structures 530, 540 positioned across the HOT wafer for patterning devices in both the first semiconductor layer 521 (i.e., the SOI regions) and the second semiconductor layer 522 (i.e., the bulk regions). Specifically, the IC structure 500 can comprise a first STI region 530 (i.e., an interface STI) positioned at the interface 535 between the second semiconductor layer 522 and the SOI stack 505. This first STI region 530 can extend vertically down to the semiconductor substrate 501. Thus, on one side 531 (i.e., on a first side), this first STI region 530 extends through the first semiconductor layer 521 and the insulator layer 510 to the semiconductor substrate 100 and on the opposite side 532 (i.e., on a second side opposite the first side), this first STI region 530 extends through the second semiconductor layer 522 to the semiconductor substrate 501. The IC structure 500 can also comprise at least one additional STI region 540. For example, an additional STI region 540 can extend through the first semiconductor layer 521 and the insulator layer 510 (and not the second semiconductor layer 522) into the semiconductor substrate 501. Another additional STI region 540 can extend through second semiconductor layer 522 only into the semiconductor substrate 501. The bottom surfaces 595 of all of these STI regions (including the first STI region 530 and any additional STI regions 540) can be homogenous, planar (i.e., divot-free) and approximately parallel to the top surface 502 of the semiconductor substrate 501. The bottom surfaces 595 of all of these STI regions 530, 540 can further be located just at the top surface 502 of the semiconductor substrate 501 or, alternatively, at a same predetermined depth 550 below the top surface 502 of the semiconductor substrate 501.

Figure 6:
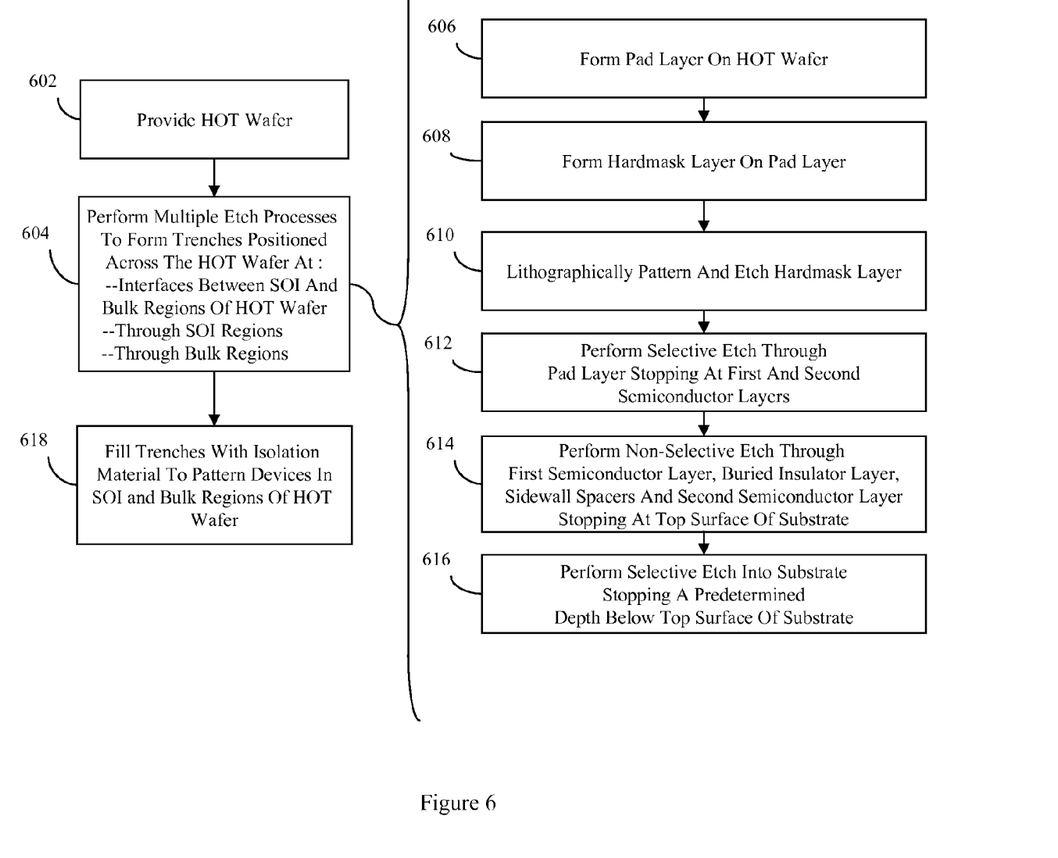
FIG. 6 is a flow diagram illustrating a method of forming the integrated circuit structure of FIG. 5.
Figure 7:
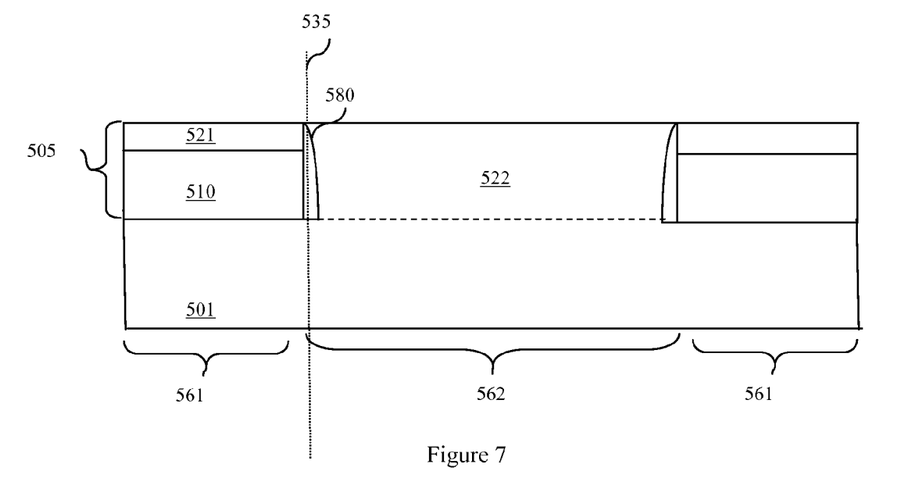
FIG. 7 is a schematic diagram illustrating a partially completed integrated circuit structure of FIG. 5.

Referring to the flow diagram of FIG. 6, also disclosed are embodiments of a method of forming the above-described IC structure 500. Specifically, the method embodiments comprise providing an HOT wafer similar to the HOT wafer 100 of FIG. 1 (602, see FIG. 7). That is, the HOT wafer can comprise a semiconductor substrate 501 (e.g., a bulk silicon substrate). A silicon-on-insulator (SOI) stack 505 can be positioned on a first portion 561 of the semiconductor substrate 501. The SOI stack 505 can comprise a buried insulator layer 510 (e.g., an approximately 1450 Å buried oxide layer) on the semiconductor substrate 101 and a first semiconductor layer 521 (e.g., an approximately 550 Å silicon layer) on the buried insulator layer 510. The first semiconductor layer 521 can have a first crystallographic orientation (e.g., a {100} orientation optimal for n-type field effect transistor (NFET) performance). A second semiconductor layer 522 can be positioned on a second portion 562 of the semiconductor substrate 501. The second semiconductor layer 522 can comprise an approximately 2000 Å epitaxial silicon layer positioned laterally adjacent to the SOI stack 105. The second semiconductor layer 522 and the semiconductor substrate 501 can have a second crystallographic orientation different from the first crystallographic orientation (e.g., a {110} orientation optimal for p-type field effect transistor (PFET) performance). The thicknesses of the second semiconductor layer 522 and the SOI stack 505 can be approximately equal (e.g., approximately 2000 Å each). Additionally, sidewall spacers 580 (e.g., nitride sidewall spacers) can be positioned immediately adjacent to and can extend the entire length of the SOI stack sidewalls. That is, the sidewall spacers 580 are positioned on the semiconductor substrate 501 between SOI stack 505 and the second semiconductor layer 522. The sidewall spacers 580 and the insulator layer 510 can comprise different dielectric materials with different etch selectivities. For example, as mentioned above, the buried insulator layer 510 can comprise an oxide material and the sidewall spacer 580 can comprise a nitride material.

Next, multiple etch processes are performed in order to simultaneously form one or more trenches positioned across the HOT wafer (604). These trenches can then be filled with an isolation material, thereby forming STI structures 530, 540 for patterning devices in both the first semiconductor layer 521 (i.e., the SOI regions) and the second semiconductor layer 522 (i.e., the bulk regions) (618, see FIG. 5). Specifically, the multiple etch processes can be performed (at process 604) in order to form a first trench at the interface between the second semiconductor layer 522 and the SOI stack 505 to the semiconductor substrate 501 and, optionally, to simultaneously form one or more additional trenches through the first semiconductor layer 521 and the buried oxide layer 510 to the semiconductor substrate 501 and/or through the second semiconductor layer 522 to the semiconductor substrate 501. The multiple etch processes can be performed so that the bottom surfaces 595 of all of these STI regions (including the first STI region 530 and any additional STI regions 540) are homogenous and planar (i.e., comprise the same divot-free material) and further are approximately parallel to the top surface 502 of the semiconductor substrate 501. They can further be performed such that the bottom surfaces 595 of all of these STI regions 530, 540 are located just at the top surface 502 of the semiconductor substrate 501 or, alternatively, at a same predetermined depth 550 below the top surface 502 of the semiconductor substrate 501.

Figure 8:
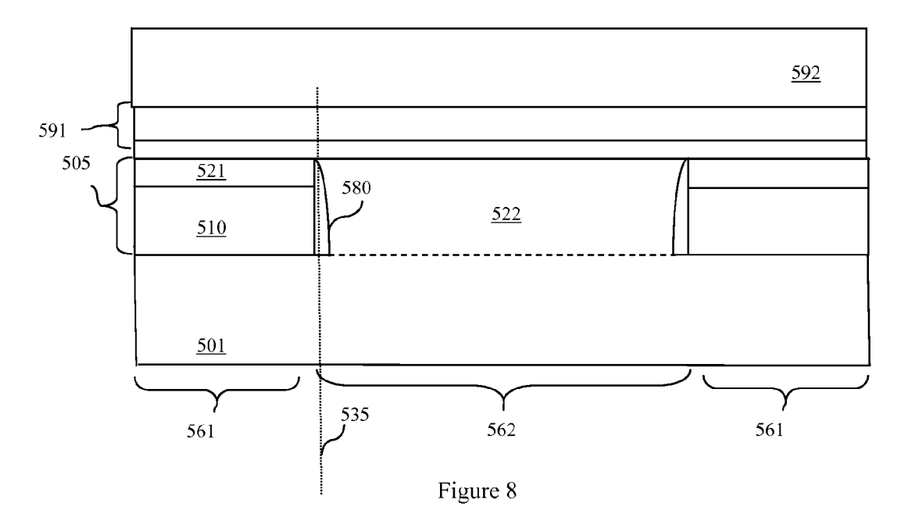
FIG. 8 is a schematic diagram illustrating a partially completed integrated circuit structure of FIG. 5.
Figure 9:
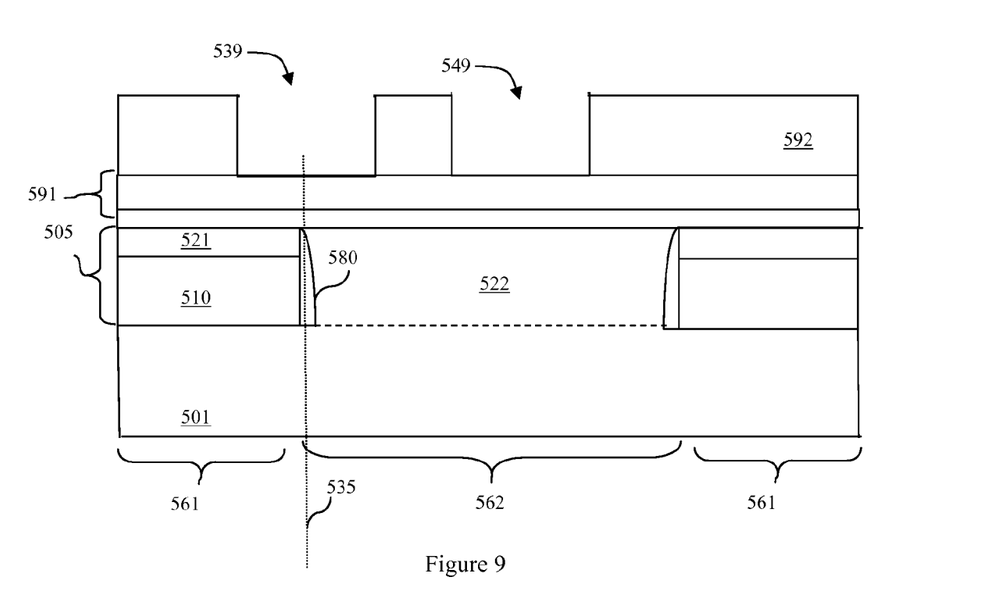
FIG. 9 is a schematic diagram illustrating a partially completed integrated circuit structure of FIG. 5.

More specifically, the multiple etch processes (604) can include, but are not limited to, the following process steps (606-616). A pad layer 591 may be formed on the HOT wafer (606, see FIG. 8). The pad layer 591 can comprise, for example, a pad oxide layer above the first and second semiconductor layers 521, 522 and an approximately 800 Å pad nitride layer above the pad oxide layer. A hardmask layer 592 can be formed on the pad layer 591 (608, see FIG. 8). The hardmask layer 592 can comprise, for example, an approximately 2800 Å boron-silicate glass (BSG) hardmask layer. The hardmask layer 592 can then be lithographically patterned and etched, using conventional lithographic patterning and etch techniques that incorporate an anti-reflective coating above the hardmask layer 592 and a photoresist layer above the ARC layer. Specifically, the hardmask layer 592 can be patterned in order to define a first trench 539 above the interface 535 between the first semiconductor layer 521 and the second semiconductor layer 522 (i.e., an interface trench 539 above the sidewall spacer 580) and, optionally, to define any additional trenches 549 (610, see FIG. 9). For example, the hardmask layer 592 can also be patterned to define one or more additional trenches 549 above only the first semiconductor layer 521 and/or above only the second semiconductor layer 522 (as illustrated). Alternatively, a bi- or tri-layer resist process can be used in place of the hardmask process.

Figure 10:
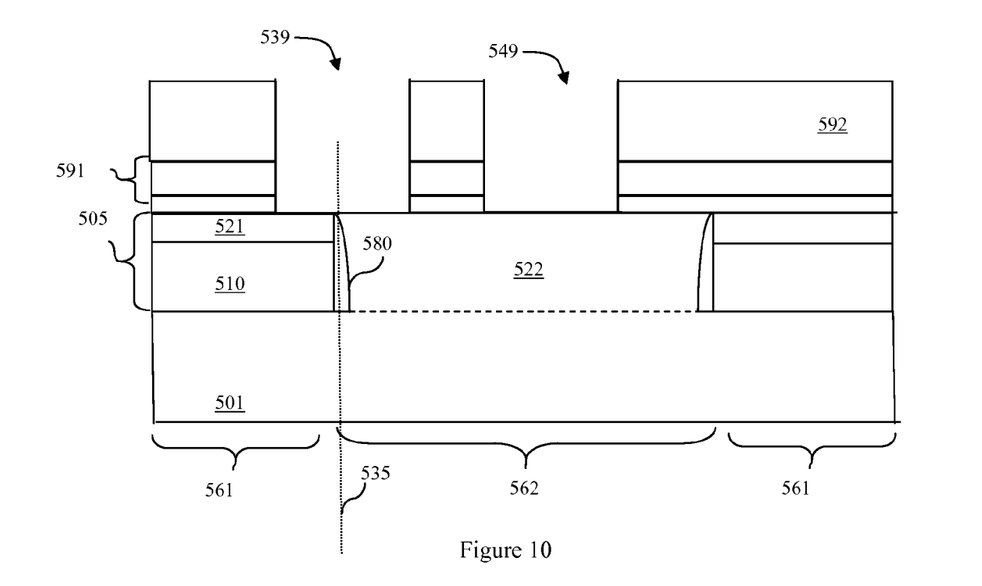
FIG. 10 is a schematic diagram illustrating a partially completed integrated circuit structure of FIG. 5.

Once the hardmask layer 592 is patterned, a selective anisotropic reactive ion etch (RIE) process can be performed in order to etch through the pad layer 591, stopping on the first semiconductor layer 521 and the second semiconductor layer 522 (612, see FIG. 10). Thus, the interface 535 between the first and second semiconductor layers 521-522 above the sidewall spacer 580 is exposed in trench 539 and, optionally, one or more designated areas of the first semiconductor layer 521 and/or the second semiconductor layer 522 (as illustrated) are exposed by additional trench(es) 549.

Figure 11:
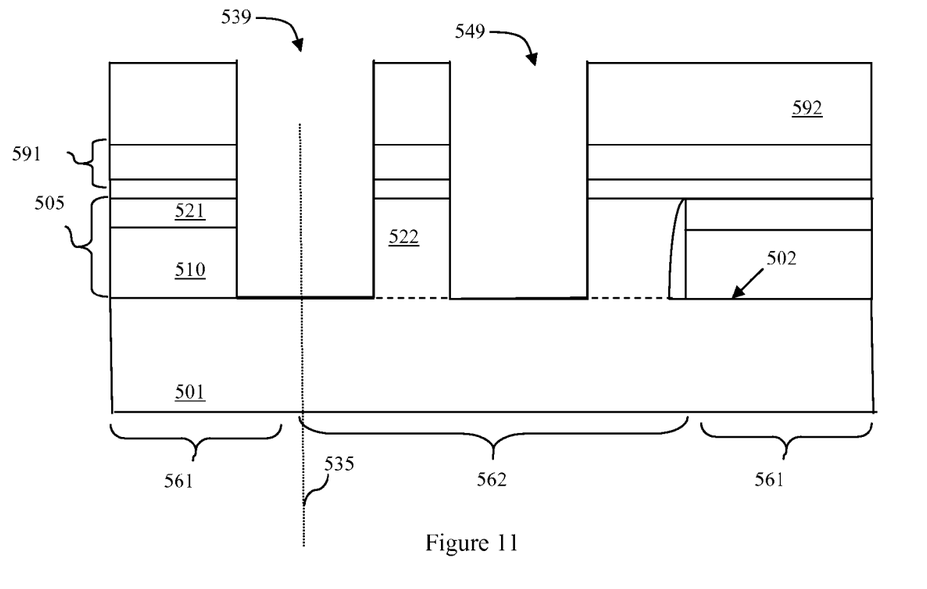
FIG. 11 is a schematic diagram illustrating a partially completed integrated circuit structure of FIG. 5.

Next, a non-selective etch process can be performed in order to remove the sidewall spacer 580 from the interface 535, to extend the first trench 539 (i.e., the interface trench) and any optional additional trenches 549 down to the semiconductor substrate 501 and further to ensure that all of the trenches, including the first trench 539 and any additional trenches 549, have essentially homogeneous (e.g., all silicon) and planar (i.e., divot-free) bottom surfaces that are approximately parallel to the top surface 502 of the substrate 501 (614, see FIG. 11). This non-selective etch process can comprise, for example, a non-selective reactive ion etch (RIE) process capable of anisotropically etching the first semiconductor layer 521, the second semiconductor layer 522, the insulator layer 510, and the sidewall spacer 580 all at a same rate. For example, the non-selective RIE process can comprise a trifluoromethane ($CHF_3$) and/or a tetraflouromethane ($CF_4$)-based RIE process. This non-selective RIE process can stop just at the top surface 502 of the semiconductor substrate 501.

Figure 12:
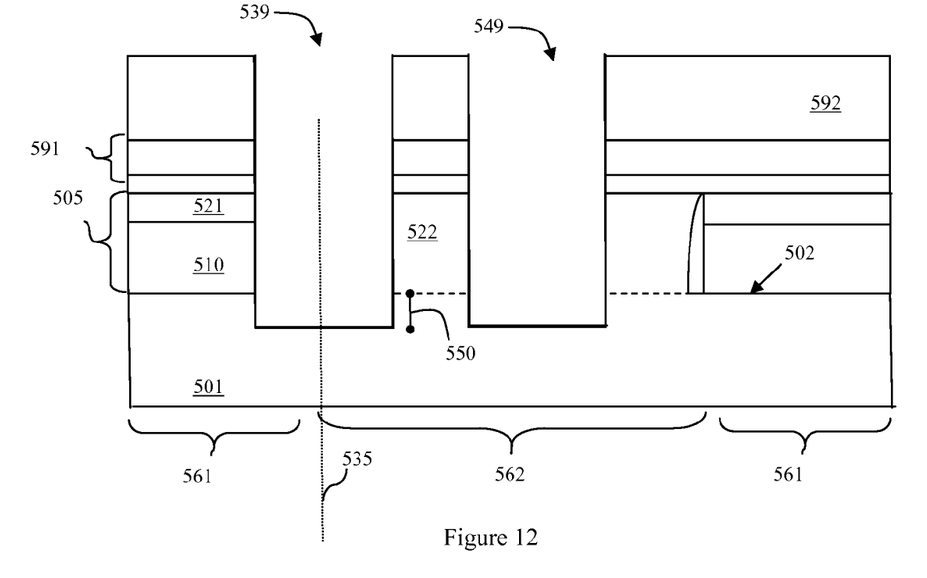
FIG. 12 is a schematic diagram illustrating a partially completed integrated circuit structure of FIG. 5.

Following the non-selective RIE process, an additional etch process can be performed in order to extend the first trench 539 (i.e., the interface trench) and any additional trenches 549 a same predetermined depth 550 into the semiconductor substrate 501 (616, see FIG. 12). This additional etch process can comprise a selective anisotropic RIE process with chemistry selective to the semiconductor substrate 501 over the insulator layer 510 to ensure that the sidewalls of the trench remain smooth and perpendicular to the substrate surface 502. For example, the additional etch process can comprise a selective anisotropic RIE process with hydrogen bromide (HBr) and oxygen (O2)-based chemistry. Once the trenches 539, 549 are etched to the desired depth, they can be filled with an isolation material (e.g, an oxide fill material) (616, see FIG. 5). Thus, the HOT wafer 500 with improved STI structures, as described above, for patterning devices in both the first semiconductor layer 521 (i.e., the SOI regions) and the second semiconductor layer 522 (i.e., the bulk regions) is created.

Therefore, disclosed above are embodiments of a hybrid-orientation technology (HOT) wafer and a method of forming the HOT wafer with improved shallow trench isolation (STI) structures for patterning devices in both silicon-on-insulator (SOI) regions, having a first crystallographic orientation, and bulk regions, having a second crystallographic orientation. The improved STI structures are formed using a non-selective etch process to ensure that all of the STI structures and, particularly, the STI structures at the SOI-bulk interfaces, extend to the semiconductor substrate and have an essentially homogeneous (i.e., single material) and planar (i.e., divot-free) bottom surface that is approximately parallel to the top surface of the substrate. Optionally, an additional selective etch process can be used to extend the STI structures a same predetermined depth into the substrate. The resulting structure is suitable for use with high-performance highly-integrated logic devices. Furthermore, is compatible with next-generation tri-layer resists which will be required for >1 NA lithography.

Hybrid-orientation technology provides performance benefits by combining NFET and PFET devices oriented optimally for their respective carrier mobility. The challenge is to provide an integration solution that is compatible with typical wafer fabrication flows, e.g., SOI or bulk substrates, for high-performance logic. Disclosed above is a wafer integration method to fabricate a patterned silicon substrate that is compatible with subsequent process sequences for a high-performance logic chip. Those skilled in the art will recognize that hybrid-orientation technology is most likely to be used for high-performance logic, but the invention described herein is not limited to this application.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A method of forming a trench isolation structure on a hybrid-orientation (HOT) wafer, said method comprising:
    forming said hybrid-orientation (HOT) wafer comprising:
        a silicon-on-insulator (SOI) stack on a semiconductor substrate, said SOI stack comprising:
            an insulator layer on said semiconductor substrate; and
            a first semiconductor layer on said insulator layer;
        a second semiconductor layer on said semiconductor substrate and positioned laterally adjacent said SOI stack, wherein top surfaces of said first semiconductor layer and said second semiconductor layer are approximately level; and
        a sidewall spacer on said semiconductor substrate positioned laterally between and in contact with both said SOI stack and said second semiconductor layer such that said first semiconductor layer is isolated from said second semiconductor layer, wherein said sidewall spacer and said insulator layer comprise different dielectric materials;
    forming a mask layer on said HOT wafer;
    forming a first trench through said mask layer such that said first trench is above said sidewall spacer and extends laterally over portions of both said SOI stack and said second semiconductor layer;
    performing multiple etch processes in order to form a second trench aligned below said first trench such that said second trench is between said second semiconductor layer and said SOI stack,
        wherein said performing of said multiple etch processes comprises performing a non-selective etch process to remove said sidewall spacer, to extend said second trench to said semiconductor substrate and to ensure that said second trench has an essentially homogeneous planar bottom surface,
        wherein said non-selective etch process comprises a non-selective reactive ion etch (RIE) process capable of anisotropically etching said first semiconductor layer, said second semiconductor layer, said insulator layer, and said sidewall spacer at a same rate; and
    filling said second trench with an isolation material.

2. The method according to claim 1, wherein said non-selective reactive ion etch process comprises a trifluoromethane (CHF$_3$) and tetrafluoromethane (CF$_4$)-based reactive ion etch (RIE) process.

3. The method according to claim 1, wherein said performing of said multiple etch processes further comprises, after said performing of said non-selective etch process, performing an additional etch process to extend said second trench a predetermined depth into said semiconductor substrate.

4. The method according to claim 3, wherein said performing of said additional etch process comprises performing a selective anisotropic reactive ion etch process with chemistry selective to said semiconductor substrate over said insulator layer.

5. The method according to claim 3, wherein said performing of said additional etch process comprises performing a selective anisotropic reactive ion etch process with hydrogen bromide (HBr) and oxygen (O2)-based chemistry.

6. The method according to claim 1, further comprising, before said forming of said mask layer, forming a pad layer on said HOT wafer and said forming of said first trench further comprising:
    lithographically patterning said hardmask layer to define said first trench; and
    anisotropically etching through said pad layer, stopping on said first semiconductor layer, said sidewall spacer and said second semiconductor layer.

7. The method according to claim 1, wherein said first semiconductor layer has a first crystallographic orientation and wherein said second semiconductor layer and said semiconductor substrate have a second crystallographic orientation different from said first crystallographic orientation.

8. A method of forming a trench isolation structure on a hybrid-orientation (HOT) wafer, said method comprising:
   forming said hybrid-orientation (HOT) wafer comprising:
      a silicon-on-insulator (SOI) stack on a semiconductor substrate, said SOI stack comprising:
         an insulator layer on said semiconductor substrate; and
         a first semiconductor layer on said insulator layer;
      a second semiconductor layer on said semiconductor substrate positioned laterally adjacent said SOI stack, wherein top surfaces of said first semiconductor layer and said second semiconductor layer are approximately level; and
      a sidewall spacer on said semiconductor substrate positioned laterally between and in contact with both said SOI stack and said second semiconductor layer such that said first semiconductor layer is isolated from said second semiconductor layer, wherein said sidewall spacer and said insulator layer comprise different dielectric materials;
   forming a mask layer on said HOT wafer;
   forming multiple first trenches through said mask layer such that a first one of said first trenches is above said sidewall spacer and extends laterally over portions of both said SOI stack and said second semiconductor layer and further such that a second one of said first trenches is above any one of said SOI stack and said second semiconductor layer;
   performing multiple etch processes in order to essentially simultaneously form multiple second trenches aligned below corresponding ones of said multiple first trenches such that a first one of said second trenches is positioned between said second semiconductor layer and said SOI stack and a second one of said second trenches extends vertically through said any one of said SOI stack and said second semiconductor layer,
      wherein said performing of said multiple etch processes comprises performing a non-selective etch process to remove said sidewall spacer, to extend said multiple second trenches to said semiconductor substrate and to ensure that said multiple second trenches have essentially homogeneous planar bottom surfaces, and
      wherein said non-selective etch process comprises a non-selective reactive ion etch (RIE) process capable of anisotropically etching said first semiconductor layer, said second semiconductor layer, said insulator layer, and said sidewall spacer at a same rate; and
   filling said second trenches with an isolation material.

9. The method according to claim 8, wherein said non-selective reactive ion etch process comprises a trifluoromethane ($CHF_3$) and tetraflouromethane ($CF_4$)-based reactive ion etch (RIE) process.

10. The method according to claim 8, wherein said performing of said multiple etch processes further comprises, after said performing of said non-selective etch process, performing an additional etch process to extend said multiple second trenches a predetermined depth into said semiconductor substrate.

11. The method according to claim 10, wherein said performing of said additional etch process comprises performing a selective anisotropic reactive ion etch process with chemistry selective to said semiconductor substrate over said insulator layer.

12. The method according to claim 10, wherein said performing of said additional etch process comprises performing a selective anisotropic reactive ion etch process with hydrogen bromide (HBr) and oxygen (O2)-based chemistry.

13. The method according to claim 8, further comprising, before said forming of aid mask layer, forming a pad layer on said HOT wafer and said forming of said multiple first trenches comprising:
   lithographically patterning said mask layer to define said multiple first trenches; and
   anisotropically etching through said pad layer, stopping on said first semiconductor layer, said sidewall spacer and said second semiconductor layer.

* * * * *